United States Patent [19]
Bladen

[11] 3,943,455
[45] Mar. 9, 1976

[54] ANALOG FEEDBACK AMPLIFIER EMPLOYING A FOUR-QUADRANT INTEGRATED CIRCUIT MULTIPLIER AS THE ACTIVE CONTROL ELEMENT

[75] Inventor: Thomas H. Bladen, Adelphi, Md.

[73] Assignee: The United States of America as represented by the Secretary of the Navy, Washington, D.C.

[22] Filed: June 3, 1974

[21] Appl. No.: 475,541

[52] U.S. Cl. .............................. 328/155; 307/262
[51] Int. Cl.² .......................................... H03B 3/04
[58] Field of Search ......... 330/25, 26, 28, 29, 30 R, 330/97; 307/229, 230, 262; 235/184, 185, 193, 194; 328/155

[56] References Cited
UNITED STATES PATENTS

| | | | |
|---|---|---|---|
| 3,031,142 | 4/1962 | Cohen et al. | 235/193 |
| 3,308,287 | 3/1967 | Levy et al. | 235/194 |
| 3,579,128 | 5/1971 | Smith et al. | 328/155 |
| 3,838,262 | 9/1974 | van de Plassche | 235/194 |

Primary Examiner—Richard A. Farley
Attorney, Agent, or Firm—R. S. Sciascia; R. F. Beers; P. Schneider

[57] ABSTRACT

An analog feedback circuit for producing a null or zero output for two either in-phase or 180° out-of-phase input signals applied to the circuit. The dc control voltage is applied along with the first input signal to a multiplier whose output is summed with the second input signal in an operational amplifier to provide the amplitude and phase of the control voltage.

3 Claims, 2 Drawing Figures

3,943,455

ANALOG FEEDBACK AMPLIFIER EMPLOYING A FOUR-QUADRANT INTEGRATED CIRCUIT MULTIPLIER AS THE ACTIVE CONTROL ELEMENT

BACKGROUND OF THE INVENTION

This invention relates generally to analog feedback circuits and more particularly to an analog feedback circuit using a four quadrant integrated circuit multiplier as the active element.

Analog feedback circuits are used to continuously produce a dc voltage analog which results in an operational null point from the amplitude and phase difference of two input signals. The amplitudes of the two in-phase signals is controlled by varying the gain of the active elements. To achieve the operational null point, the analog feedback amplifier is connected with a limiter, a phase detector and sample and hold integrator to complete the feedback loop. In the past, one type of analog feedback circuit employed varistor semiconductors for the variable resistance elements therein. Though generally satisfactory, the prior art varistor analog feedback circuits were somewhat unstable and noisy. In addition, they tended to be nonlinear in operation and to lack a large dynamic signal range. Another type of analog feedback circuit employed rayistor semiconductors as the variable resistance elements therein. Again, while generally satisfactory, the rayistor type analog feedback device was somewhat unstable and lacked adequate temperature stability. Other designs employing nonlinear components as replacements for the varistors presently used have been developed but have been discarded as not demonstrating sufficient improvement in system performance.

SUMMARY OF THE INVENTION

Accordingly, there has been provided a new analog feedback amplifier employing a four-quadrant integrated circuit multiplier as the active element, in place of the active varistor elements and the polarity inverter stage. The first ac voltage and the dc control voltage are supplied to the multiplier which provides an output either in-phase or out-of-phase with respect to the first voltage which is then summed in an operational amplifier with a second ac analog voltage. The output of the operational amplifier controls the dc control voltage through an external feedback loop whereby the operational amplifier output is caused to be nulled.

OBJECTS OF THE INVENTION

It is therefore an object of the present invention to provide a new and improve analog feedback circuit.

Another object of the present invention is to provide an analog feedback amplifier employing a four-quadrant integrated circuit multiplier as the active element.

Still another object of the present invention is to provide an analog feedback circuit which is stable, quiet and provides simplified null adjustments.

Yet another object of the present invention is to provide an analog feedback circuit not having an inverter stage and exhibiting linear operation over a large dynamic range.

BRIEF DESCRIPTION OF THE DRAWINGS

A more complete appreciation of the invention and many of the attendant advantages thereof will be readily appreciated as the same becomes better understood by reference to the following detailed description when considered in connection with the accompanying drawings wherein.

DETAILED DESCRIPTION OF THE INVENTION

Figure 1:
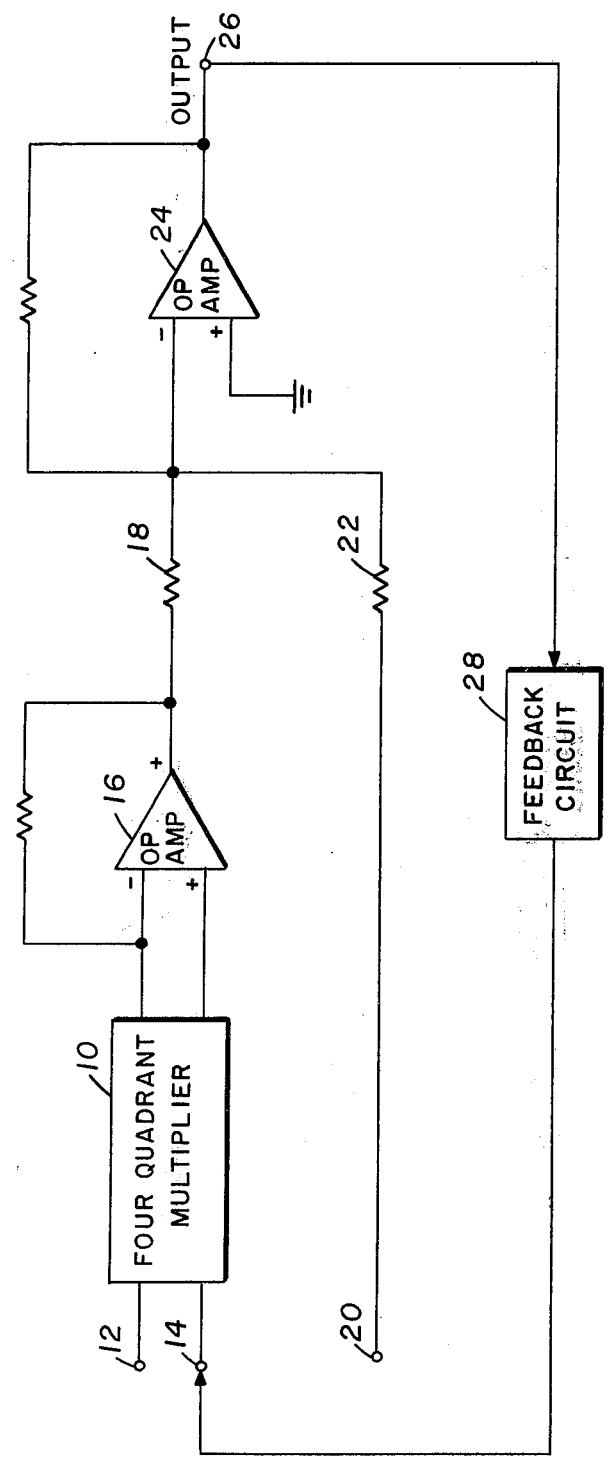
FIG. 1 is a block diagrammatic view of the overall analog circuit in accordance with the present invention.

Referring now to the drawings wherein like reference characters designate identical or corresponding parts throughout the several views, and more particularly to FIG. 1 thereof wherein the overall analog feedback circuit is shown with an integrated circuit multiplier 10 having a first input terminal 12 for application of a first ac analog summing voltage signal, and a second input terminal 14 for application of a dc analog control voltage signal. Since the summing and control voltage signal execursions can be both positive and negative, a four quadrant multiplier is employed, one such multiplier being a MC 1595 L Motorola which operates on the transconductance transistor concept and whose design is based on the "current-gain cell" to obtain linear amplification over the normal operating range. Multiplier 10 provides differential output signals which are either in-phase or 180° out-of-phase with respect to the summing voltage, which are then supplied to conventional operational amplifier 16 to supply the necessary gain. Amplifier 16 also provides the needed high load impedance and common mode input voltage characteristics and supplies the multiplied signal to summing resistor 18. A third input terminal 20 provides for the application of a second ac analog voltage signal which is either in phase or 180° out-of-phase with the first ac analog voltage signal and is to be nulled therewith. The second analog voltage signal is applied to a summing resistor 22 whose output is applied with the output from summing resistor 18 to be added in a conventional operational amplifier 24 to provide an output voltage at terminal 26. A feedback 28 which may include a phase detector, is coupled between output terminal 26 and input terminal 14 to vary the dc control voltage of positive or negative polarity depending upon the relative amplitude and phase at the first and second analog ac voltage input signals until the desired nulling effect is achieved. It should be understood that if the analog voltage input signals applied to terminals 12 and 20 are continuously changing, that the dc control voltage applied at terminal 14 developed by feedback circuit 28 will allow for a nulled or zero output signal at output terminal 26 to be continuously and automatically maintained, i.e., whereby the outputs of summing resistors 18 and 22 are equal and opposite in phase by 180°. Operational amplifiers 16 and 24 may be of the 741 microcircuit type manufactured by both Fairchild and Motorola.

Figure 2:
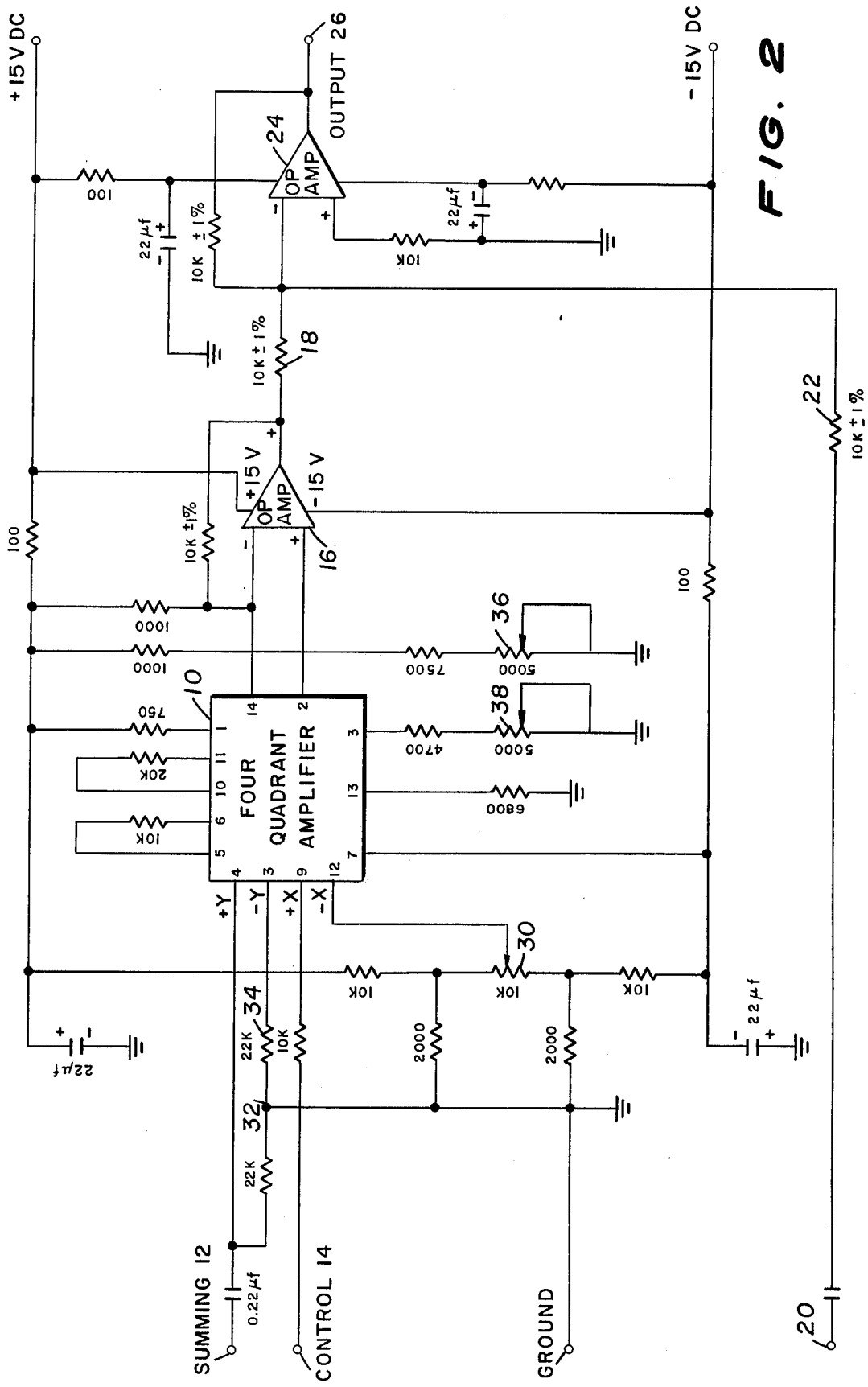
FIG. 2 is a detailed schematic diagram of a particular embidment of the analog feedback device in accordance with the present invention.

FIG. 2 shows a specific circuit which may be used to implement the combination of the invention illustrated in FIG. 1. The circuits of FIG. 2 are by way of illustration only, since various other circuits may be utilized to implement the combination. More particularly, the X and Y inputs of multiplier 10 are connected to produce in-phase and 180° out-of-phase summing outputs from positive and negative control voltages. Summing signal applied to terminal 12 is connected to the Y multiplier input and the control voltage applied to terminal 14 is connected to the X input since the linearity error of the X input is 1% and that of the Y input 2%. A balance potentiometer 30, connected in series with a voltage divider between the ± 15 v dc power supplies, is provided at the X input to adjust the zero control voltage null point. The Y input is referenced to ground by resistors 32 and 34 since ac coupling in the signal circuitry precludes the need for a balance adjustment.

The differential output signal from multiplier 10 is connected to the input terminals of operational amplifier 16 to obtain the single ended in-phase or 180° out-of-phase output signal applied to summing amplifier 24. Amplifier 16 also provides the needed high load impedence, common mode input voltage characteristics and produces the necessary gain of 20 dB to replace the signal loss through the multiplier 10. Control of the offset voltage in amplifier 16 is accomplished by adjusting potentionmeter 36 for a zero dc voltage at the analog feedback amplifier output terminal 26.

Summing amplifier 24 is connected for a gain of $\theta$ db and functions to produce an output null by summing the in-phase or 180° out-of-phase signal from summing resistor 18 with that of summing resistor 22, both of which are accurate to 1%. Control of the multiplier 10 gain is accomplished by adjustment of potentionmeter 38 to the desired output amplitude for a given control voltage.

All signal circuitry is designed for minimum phase shift and adequate bandwidth for the nominal signal frequencies, with dc power supply decoupling provided for the multiplier 10 and operational amplifier 10.

It should be apparent that the instant analog feedback circuit employing a four-quadrant integrated circuit multiplier as the active element provides a circuit which is stable, quiet, exhibits linear operation over a large dynamic signal range. This new circuit also provides simplified null adjustments, eliminates the need for a summing signal polarity inverter stage and connection to a ± 20 V dc power supply, as required in previous circuits.

Obviously, numerous modifications and variations of the present invention are possible in the light of the above teachings. For example the dc control voltage may be provided by a manually opened selective switch across a dc supply. It is therefore to be understood that within the scope of the appended claims the invention may be practiced otherwise than as specifically described herein.

What is claimed as new and desired to be secured by Letters Patent of the United States is:

1. An analog feedback circuit comprising:
   a four quadrant multiplier for receiving a first ac analog voltage input signal and a dc control voltage input signal and supplying an output signal;
   a first summing resistor for receiving said multiplier output signal and providing an analog output therefrom;
   a second summing resistor for receiving a second analog voltage input signal of either in-phase or 180° out-of-phase relationship with said first analog voltage input signal and for providing an analog output therefrom;
   means for summing said outputs from said first and second summing resistors; and
   feedback circuit means coupled between said summing means and said dc control input for continously providing a nulled or zero output from said summing means by controlling said dc control voltage input signal.

2. An analog feedback circuit as recited in claim 1 wherein said summing means comprises an operational amplifier, and wherein said feedback circuit includes a phase detector.

3. An analog feedback circuit as recited in claim 2 further including an operational amplifier coupled between said multiplier and said first summing resistor for converting said multiplier output from a differential output signal to a single ended in-phase or 180° out-of-phase output signal with respect to said first ac analog input voltage.

* * * * *